US009698015B2

(12) United States Patent
Nemani (10) Patent No.: US 9,698,015 B2
(45) Date of Patent: Jul. 4, 2017

(54) METHOD FOR PATTERNING A SEMICONDUCTOR SUBSTRATE

(71) Applicant: Applied Materials, Inc., Santa Clara, CA (US)

(72) Inventor: Srinivas D. Nemani, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/505,154

(22) Filed: Oct. 2, 2014

(65) Prior Publication Data

US 2015/0108619 A1    Apr. 23, 2015

Related U.S. Application Data

(60) Provisional application No. 61/893,846, filed on Oct. 21, 2013.

(51) Int. Cl.
*H01L 21/31* (2006.01)
*H01L 21/033* (2006.01)

(52) U.S. Cl.
CPC ................................ *H01L 21/0337* (2013.01)

(58) Field of Classification Search
CPC ..... H01L 21/3081; H01L 21/31; H01L 29/02; H01L 29/06
USPC ................... 257/632; 438/758, 778
See application file for complete search history.

(56) References Cited

U.S. PATENT DOCUMENTS

| | | | | |
|---|---|---|---|---|
| 6,107,149 A | * | 8/2000 | Wu | H01L 27/092 257/336 |
| 6,472,283 B1 | * | 10/2002 | Ishida | H01L 29/6653 438/230 |
| 6,667,510 B2 | * | 12/2003 | Wu | H01L 29/42324 257/315 |
| 6,690,058 B2 | * | 2/2004 | Wu | H01L 29/7887 257/316 |
| 6,703,661 B2 | * | 3/2004 | Wu | G11C 16/0491 257/314 |
| 6,746,918 B2 | * | 6/2004 | Wu | H01L 27/11521 257/314 |
| 6,891,262 B2 | * | 5/2005 | Nomoto | H01L 21/2815 257/315 |
| 7,005,335 B2 | * | 2/2006 | Ghozeil | H01L 21/28273 257/E21.209 |

(Continued)

OTHER PUBLICATIONS

Sadjadi, et al.; Plasma-Assisted CD Shrink and Overlay Metrology Techniques for Double Patterning; ISSM Paper: PE-O-167; 1-4244-1142-4/07; 2007; pp. 432-434.

*Primary Examiner* — Jay C Kim
(74) *Attorney, Agent, or Firm* — Patterson + Sheridan, LLP (57) ABSTRACT

Embodiments of the present disclosure provide methods for patterning rectangular features with a sequence of lithography, atomic layer deposition (ALD) and etching. Embodiment of the present disclosure includes forming first line clusters along a first direction and second line clusters over the first line clusters in a direction traversing the first direction. The first and second line clusters both include core lines formed from a core material, spacers formed from first and second materials by ALD and etching. After formation of the first and second line clusters, rectangular openings can be formed by selectively etching one or two of the core material, the first material or the second material.

9 Claims, 10 Drawing Sheets

(56) References Cited

U.S. PATENT DOCUMENTS

| | | | | |
|---|---|---|---|---|
| 7,078,762 B2* | 7/2006 | Ishii | ................ | B82Y 10/00 |
| | | | | 257/316 |
| 7,244,984 B2* | 7/2007 | Kamigaichi | ......... | H01L 27/115 |
| | | | | 257/315 |
| 7,390,746 B2* | 6/2008 | Bai | ................ | H01L 21/0337 |
| | | | | 257/E21.038 |
| 7,429,536 B2* | 9/2008 | Abatchev | ............ | H01L 21/0337 |
| | | | | 257/E21.038 |
| 7,473,589 B2* | 1/2009 | Lai | ................ | H01L 21/28282 |
| | | | | 257/E21.17 |
| 7,473,644 B2* | 1/2009 | Lane | ................ | H01L 21/0337 |
| | | | | 257/E21.023 |
| 7,569,877 B2* | 8/2009 | Heath | ................ | B82Y 10/00 |
| | | | | 257/296 |
| 7,572,572 B2* | 8/2009 | Wells | ................ | H01L 27/101 |
| | | | | 430/311 |
| 7,671,475 B2* | 3/2010 | Kamigaichi | ....... | G11C 16/0483 |
| | | | | 257/315 |
| 7,772,126 B2* | 8/2010 | Bach | ................ | H01L 21/31144 |
| | | | | 257/734 |
| 7,969,760 B2* | 6/2011 | Ishii | ................ | H01L 27/0207 |
| | | | | 365/185.13 |
| 7,981,592 B2* | 7/2011 | Chan | ................ | H01L 21/0273 |
| | | | | 430/314 |
| 8,101,497 B2* | 1/2012 | Juengling | ........... | H01L 27/1087 |
| | | | | 257/E21.546 |
| 8,357,435 B2 | 1/2013 | Lubomirsky et al. | | |
| 8,449,942 B2 | 5/2013 | Liang et al. | | |
| 8,575,032 B2* | 11/2013 | Light | ................ | H01L 21/0337 |
| | | | | 438/703 |
| 8,629,048 B1* | 1/2014 | Sipani | ................ | H01L 21/0337 |
| | | | | 438/587 |
| 8,652,968 B2* | 2/2014 | Yu | ................ | H01L 21/0337 |
| | | | | 438/699 |
| 8,785,327 B2* | 7/2014 | Kikutani | ............ | H01L 27/11573 |
| | | | | 438/618 |
| 8,975,178 B2* | 3/2015 | Kikutani | ............ | H01L 21/0337 |
| | | | | 438/618 |
| 9,012,326 B2* | 4/2015 | Kim | ................ | H01L 21/76816 |
| | | | | 257/E21.231 |
| 2003/0008488 A1* | 1/2003 | Iijima | ................ | G11C 16/0416 |
| | | | | 438/587 |
| 2009/0263972 A1 | 10/2009 | Balseanu et al. | | |
| 2012/0009523 A1* | 1/2012 | Lee | ................ | H01L 21/0337 |
| | | | | 430/312 |
| 2012/0241834 A1* | 9/2012 | Nakajima | ........... | H01L 21/0337 |
| | | | | 257/316 |
| 2013/0115778 A1 | 5/2013 | Xue et al. | | |
| 2013/0189845 A1 | 7/2013 | Kim et al. | | |
| 2013/0217240 A1 | 8/2013 | Mallick et al. | | |
| 2014/0170853 A1 | 6/2014 | Shamma et al. | | |
| 2015/0155176 A1 | 6/2015 | Mignot et al. | | |

\* cited by examiner

METHOD FOR PATTERNING A SEMICONDUCTOR SUBSTRATE

CROSS-REFERENCE TO RELATED APPLICATIONS

This application claims priority to U.S. Provisional Patent Application Ser. No. 61/893,846, filed on Oct. 21, 2013, which herein is incorporated by reference.

BACKGROUND

Field

Embodiments of the present disclosure generally relate to methods for patterning a semiconductor substrate. More particularly, embodiments of the present disclosure relate to method of forming a pattern with rectangular openings.

Description of the Related Art

The continued demand for miniaturization in circuit technology has driven the size of circuit features to below 10 nm. Patterning features in such scale becomes extremely challenging. Double patterning and quadruple patterning have been adopted to achieve in patterning line gratings. However, the state-of-art double patterning and quadruple patterning technology cannot achieve the same level of success in patterning "cuts", i.e. rectangular features. Overlay errors due to multiple exposures required to patterning cuts, edge placement errors, and etch proximity effects, among other errors, become more pronounced in patterning cuts.

Therefore, there is a need for improved patterning schemes for forming rectangular features.

SUMMARY

Embodiments of the present disclosure provide methods for patterning rectangular features.

One embodiment of the present disclosure provides a method for patterning a substrate. The method includes forming a hardmask layer over the substrate forming first line clusters along a first direction. The first line clusters are separated by parallel gaps, each of the first line clusters comprises a core line formed from a core material and at least first spacers formed from a first material, forming a gap fill layer to planarize the first line clusters. The method further includes forming second line clusters over the gap fill layer along the second direction. The second direction substantially traverses the first direction, and each of the second line clusters comprises a traverse core line and at least first traverse spacers. The method further includes selectively etching the core material or the first material.

Another embodiment provides a method for forming a pattern comprising rectangular openings. The method includes forming core lines along a first direction, wherein core lines are formed from a core material, depositing a first material over the core lines by ALD, selectively etching the first material to form first spacers in contact with the core lines, and forming a gap fill layer over the core lines and the first spacers. The method further includes forming traverse core lines along a second direction, wherein the traverse core lines are formed from the core material, the second direction substantially traverses the first direction, depositing the first material over the traverse core lines by ALD, selectively etching the first material to form first traverse spacers in contact with the traverse core lines, and selectively etching the core material or the first material.

Yet another embodiment provides a substrate stack configured for forming a pattern having rectangular openings. The substrate stack includes a hardmask layer formed over the substrate to be patterned, a first layer of line clusters and a second layer of line clusters over the first layer of line clusters. The first layer of line clusters includes core lines on the hardmask layer along a first direction, wherein the core lines are formed from a core material, first spacers contacting each core line at both sides, wherein the first spacers are formed from the first material, second spacers contacting the first spacers, wherein the second spacers are formed from the second material, and the core material, the first material and the second material are different materials and can be selectively etched from one another, and a gap fill layer filing gaps between the second spacers. The second layer of line clusters includes traverse core lines formed on gap fill layer along a second direction, wherein the second direction substantially traverses the first direction, and the traverse core lines are formed for the core material, first traverse spacers contacting each traverse core line at both sides, wherein the first traverse spacers are formed from the first material or the second material, and second traverse spacers contacting the first traverse spacers, wherein the second traverse spacers are formed from one of the first material and the second material second, and first traverse spacers and the second traverse spacers are formed from different materials.

Another embodiment of the present disclosure provides a cluster tool arrangement. The cluster tool includes a transfer chamber, two or more ALD chambers coupled to the transfer chamber, two or more etch chambers coupled to the transfer chamber, and a FCVD chamber coupled to the transfer chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 1A1-1H3 schematically illustrate a sequence for generating a pattern having rectangular openings according to one embodiment of the present disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure provide methods for patterning rectangular features with a sequence of lithography, atomic layer deposition (ALD) and etching. Embodiment of the present disclosure includes forming first line clusters along a first direction and second line clusters over the first line clusters in a direction traversing the first direction. The first and second line clusters both include core lines formed from a core material, spacers formed from first and second materials by ALD and etching. After formation of the first and second line clusters, rectangular openings can be formed by selectively etching one or two of the core material, the first material or the second material.

FIGS. 1A1-1H3 schematically illustrate a sequence for generating a pattern having rectangular openings according to one embodiment of the present disclosure. Each of FIGS. 1A-1H includes one or two schematic sectional views. Each of FIGS. 1A-1F includes a sectional view and a top view of a substrate stack being processed. Each of FIGS. 1G-1H includes two sectional views and a top view of a substrate stack being processed.

Figure 1A:
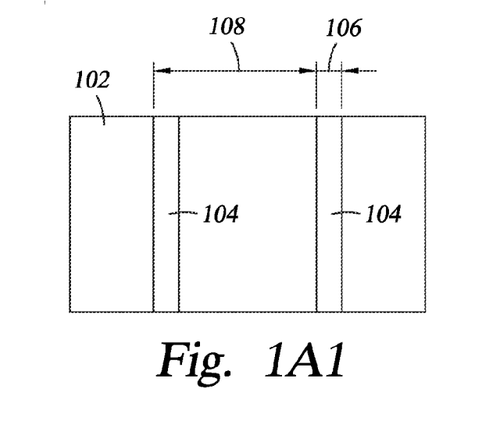
Figure 1A:
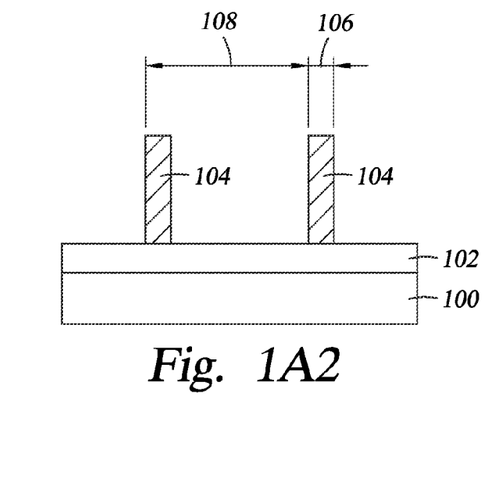

Referring first to FIGS. 1A1-1A2, a hardmask layer 102 is formed on a substrate 100 to be patterned. The substrate 100 may be a bare substrate or a substrate having one or more layers formed thereon. A pattern with rectangular openings (also known as cuts) is to be formed on the hardmask layer 102 by embodiments of the present disclosure. The pattern may be transferred from the hardmask layer 102 to the substrate 100 by etching through the patterned hardmask layer 102. The hardmask layer 102 may be formed form a material that is highly resistant to etching plasma used in the subsequent patterning process. In one embodiment, the hardmask layer may be formed from carbon, silicon nitride, metal oxides, such as $TiO_2$, $Al_2O_3$, $ZrO_2$, or silicon oxynitride. Core lines 104 are formed over the hardmask layer 102. The core lines 104 may includes a plurality of parallel lines having a CD (critical dimension) 106 and a pitch 108. The core lines 104 form a core of the structure used for the subsequent pattern forming process. The core lines 104 may be formed from a layer of core material. The core material may be amorphous silicon, amorphous silicon oxide, amorphous carbon, polycrystalline silicon, silicon nitride, or other suitable material. Depending on the CD 106 and the pitch 108, the core lines 104 may be formed by a standard photolithography process or a double or multiple patterning process.

Referring then to FIGS. 1B1-1B2, a first spacer layer 110 is formed over the core lines 104. The first spacer layer 110 may be formed by an ALD process so that a uniform thickness 112 may be conformally formed over the core lines 104 and the hardmask layer 102. The thickness 112 of the first spacer layer 110 may be controlled by the duration of the ALD process, and/or flow rate or concentration of precursor gases used in the ALD process.

Figure 1B:
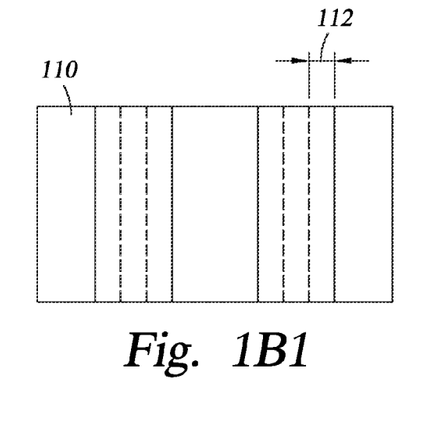
Figure 1B:
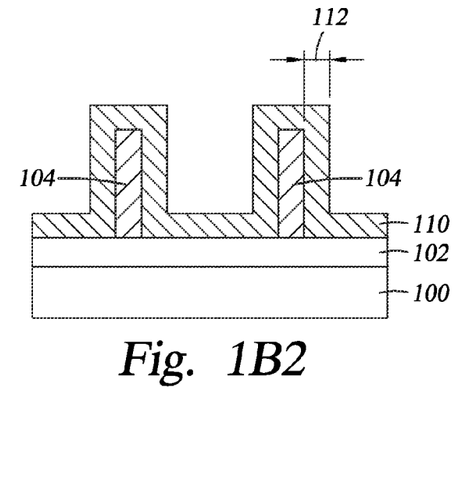
Figure 1C:
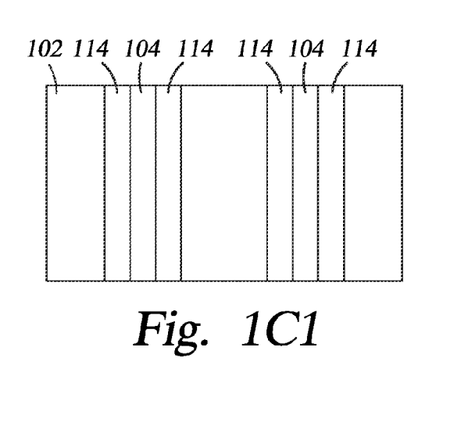
Figure 1C:
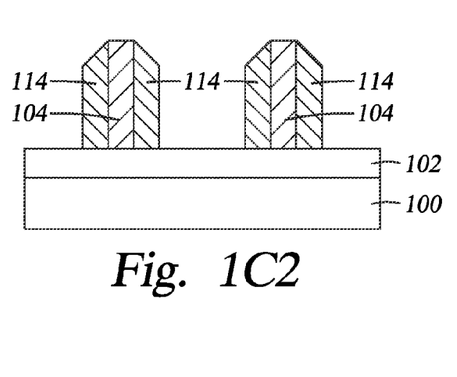

The first spacer layer 110 may be formed from a material different than the core material of the core lines 104 so that the first spacer layer 110 may be selectively removed, for example, by etching, from the core lines 104. In one embodiment, the first space layer 110 may be one of silicon oxide, silicon nitride, titanium nitride, titanium oxide, phosphorous doped silicon oxide, boron doped silicon oxide, aluminum oxide, or the like.

Referring to FIGS. 1C1-1C2, first spacers 114 are formed adjacent the core lines 104. The first spacers 114 may be formed by performing a dry etching process to remove portions of the first spacer layer 110 until the hardmask layer 102 and the top of the core lines 104 are exposed. The width of the first spacers 114 is substantially the same as the thickness 112 of the first spacer layer 110.

Referring to FIGS. 1D1-1D2, a second spacer layer 116 is formed over the core lines 104 and the first spacers 114. The second spacer layer 116 may be formed by an ALD process so that a uniform thickness 118 may be conformally formed over the core lines 104, the first spacers 114 and the hardmask layer 102. The thickness 118 of the second spacer layer 116 may be controlled by controlling the duration of the ALD process, and/or flow rate or concentration of precursor gases used in the ALD process.

Figure 1D:
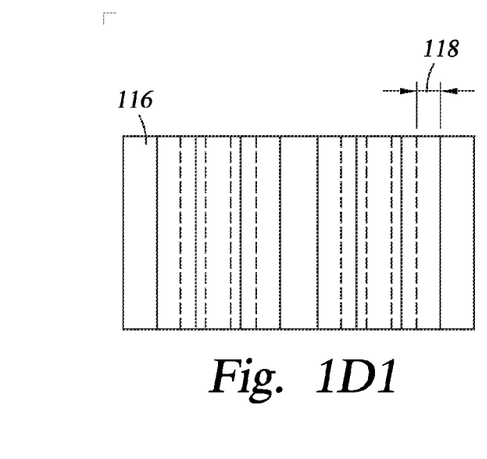
Figure 1D:
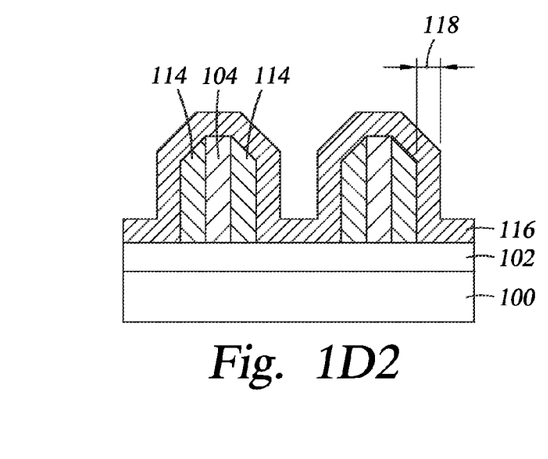

The second spacer layer 116 may be formed from a material different than the material of the first spacer layer 110 and the core material of the core lines 104 so that the second spacer layer 116 may be selectively etched from the first spacers 114 and the core lines 104. In one embodiment, the second spacer layer 116 may be one of silicon oxide, silicon nitride, titanium nitride, titanium oxide, phosphorous doped oxide, aluminum oxide, or the like.

Referring to FIGS. 1E1-1E2, second spacers 120 are formed adjacent the first spacers 114. The second spacers 120 may be formed by performing a dry etching process to remove portions of the second spacer layer 116 until the hardmask layer 102, the top of the first spacers 114 and the top of the core lines 104 are exposed. The width of the second spacers 120 is substantially the same as the thickness 118 of the second spacer layer 116. The core lines 104, the first spacers 114 and the second spacers 120 form line clusters 121 separated by gaps 122 therebetween.

Figure 1E:
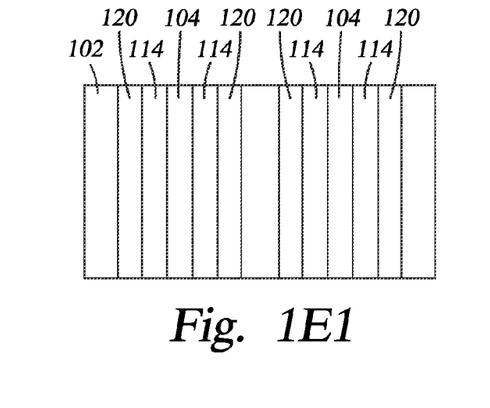
Figure 1E:
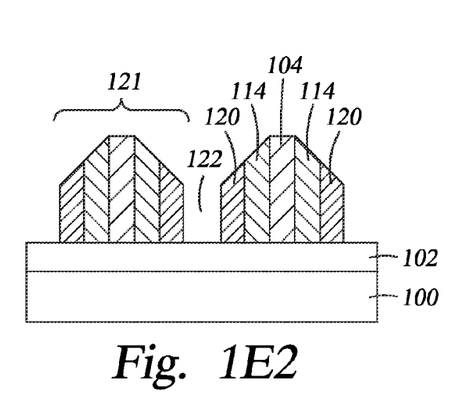
Figure 1F:
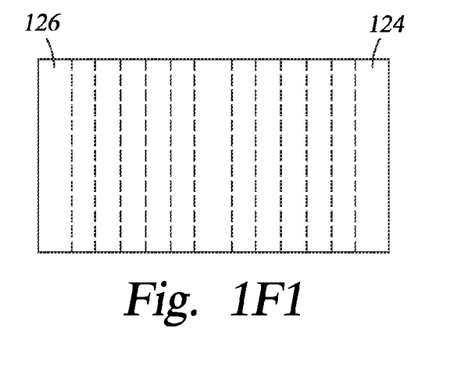
Figure 1F:
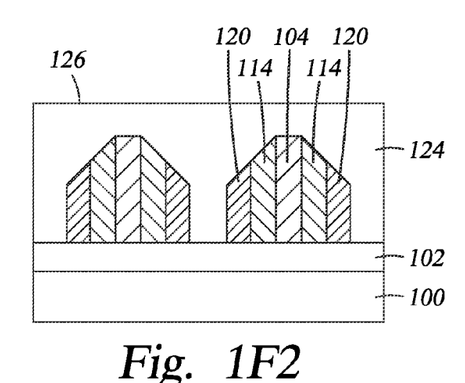
Figure 1G:
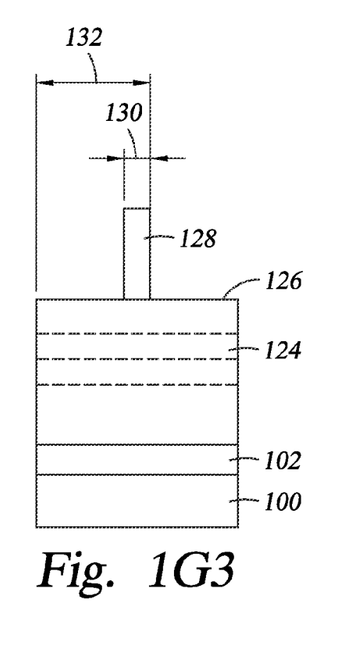
Figure 1G:
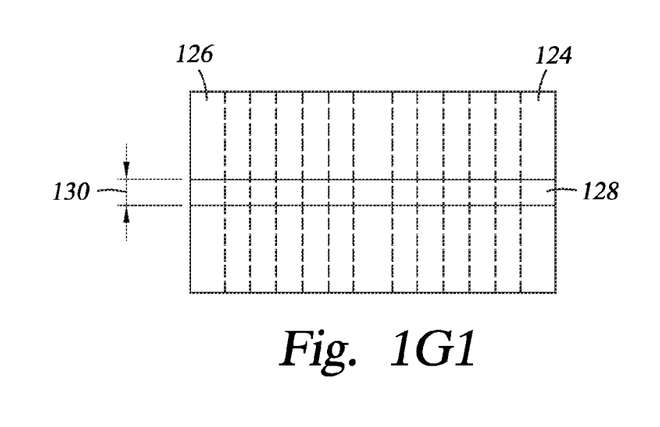
Figure 1G:
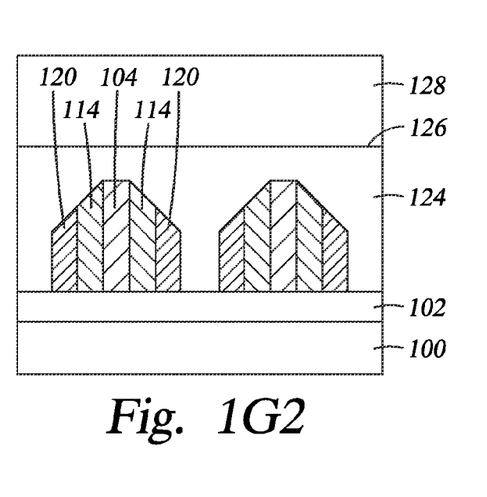

Even though, only the first spacers 114 and second spacers 120 are illustrated, additional spacers may be formed in the line clusters 121 outside the second spacers 120 in the same manner to fulfill design requirement. The additional spacers may be formed from materials different from the first spacers 114, second spacers 120 and the core lines 104 to enable selective etching.

Referring to FIGS. 1F1-1F2, a gap fill layer 124 is formed over the core lines 104, the first spacers 114 and the second spacers 120 to fill the gaps 122. The gap fill layer 124 may be formed by a FCVD (flowable chemical vapor deposition) process to ensure the gaps 122 are completed filled from bottom up and yield a substantially planar top surface 126. The gap fill layer 124 may be a silicon oxide layer or silicon nitride layer formed by FCVD. Alternatively, the gap fill layer 124 may be an anti-reflective coating, such as DARC (dielectric anti-reflective coating) or BARC (bottom anti-reflective coating).

Referring to FIGS. 1G1-1G3, traverse core lines 130 are formed over the planar top surface 126 of the gap fill layer 124. Similar to the core lines 104, the traverse core lines 128 may be formed from a core material through a standard photolithography process or a double/multiple pattern process depending on a CD 130 or pitch 132 of the core lines 104. The traverse core lines 128 are formed in the direction traversing the core lines 104.

Referring to FIGS. 1H1-1H3, first traverse spacers 134 and second traverse spacers 136 are formed sequentially adjacent the traverse core lines 128 using ALD and etch. The traverse core lines 128, the first traverse spacers 134 and the second traverse spacers 136 form parallel traverse line clusters 142 separated by gaps 144 therebetween. More traverse spacers may be formed outside the second traverse spacers 136 to obtain desired pattern. The line clusters 121 and the traverse line clusters 142 may include the same number of spacers or different numbers of spacers according to form desired patterns. As shown in FIGS. 1A-1H, both the first line clusters 121 and the traverse line spacers 142 have two spacers. Alternatively, the line clusters 121 may include two spacers while the traverse line clusters 142 may include only one spacer. The traverse core lines 128, the first and second traverse spacers 134, 136 are formed from different materials to enable selective etching. CD 130 and pitch 132 of the traverse core lines 128, thickness 138 of the first traverse spacers 134, and thickness 140 of the second traverse line spacers 136 may be selected according to design of the target pattern.

Figure 1H:
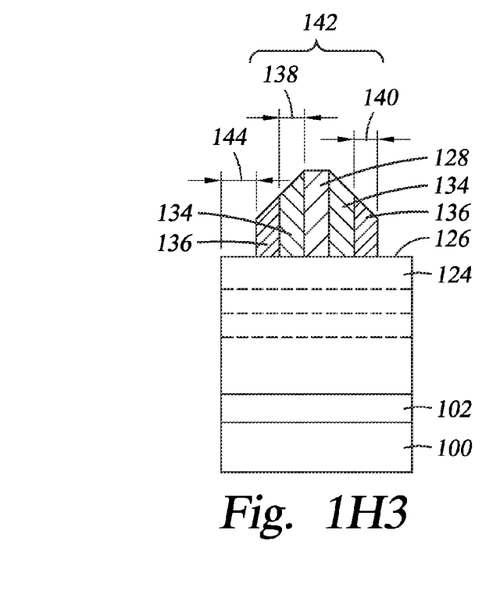
Figure 1H:
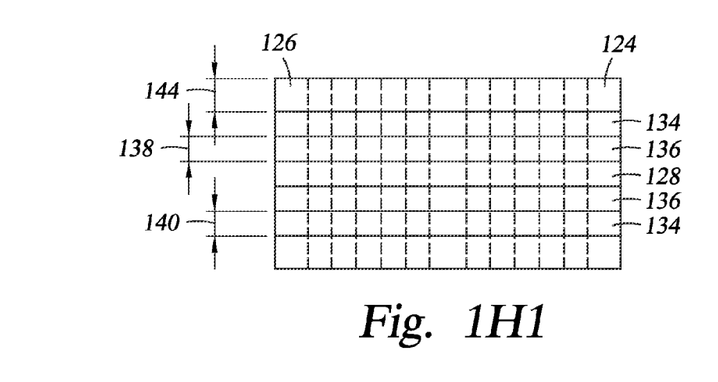
Figure 1H:
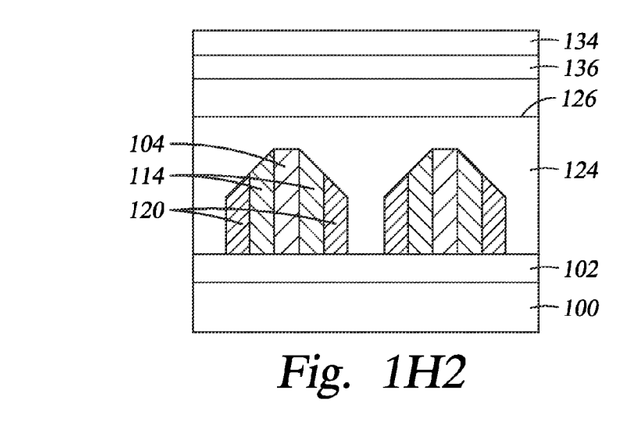

In one embodiment, to enable patterning the hardmask layer 102, the traverse core lines 128 and the core lines 104 may be formed from the same material and the first traverse spacers 134 and the second traverse spacers 136 may be formed from the same materials as the first spacers 104 and the second spacers 120. As illustrated in FIGS. 1H1-1H3, the first traverse spacers 134 are formed from the same material as the first spacers 114 and the second traverse spacers 136 may be formed from the same material as the second spacers 120. Alternatively, the first traverse spacers 134 may be formed from the same material as the second spacers 120 and the second traverse spacers 136 may be formed from the same material as the first spacers 114.

The line clusters 121 and the traverse line clusters 144 shown in FIGS. 1H1-1H3 are now ready to generate a pattern having rectangular openings over the hardmask layer 102 by selectively removing one or two of the core lines and the spacers. FIGS. 2A-2D schematically illustrate various patterns formed using the substrate stack shown in FIG. 1H.

After formation of traversing core lines and spacer clusters, as shown in FIG. 1H, patterns having rectangular openings may be formed by etching one or more of the core material and the spacer materials. During the etch process, rectangular areas that is covered by the material being etched in both the core lines level and the traverse core lines level are etched through exposing the hardmask layer 104 underneath.

Figure 2A:
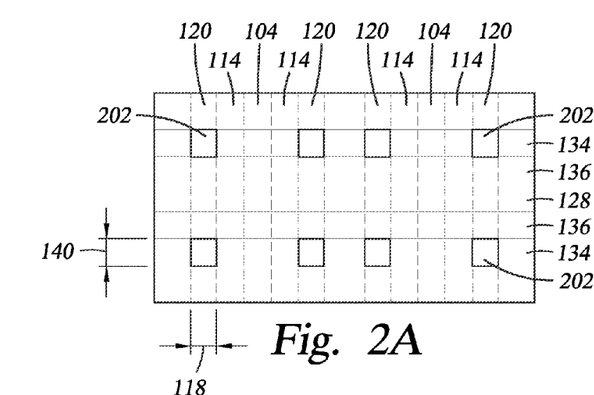
FIGS. 2A-2D schematically illustrate various patterns formed using the sequence according to embodiments of the present disclosure.

Referring to FIG. 2A, a plurality of rectangular openings 202 are formed by selectively etching through the second spacers 120 and the second traverse spacers 136, which are formed from the same material. Because the core material of the core lines 104 and the traverse core lines 128 and the material of the first spacers 114 and the first traverse spacers 134 are highly resistive to the etching chemistry, the core lines 104, 128 and first spacers 114, 134 remain substantially intact. The remaining core lines 104, 128 and first spacers 114, 134 may be used as mask to transfer the rectangular openings 202 to the hardmask layer 102 underneath.

Figure 2B:
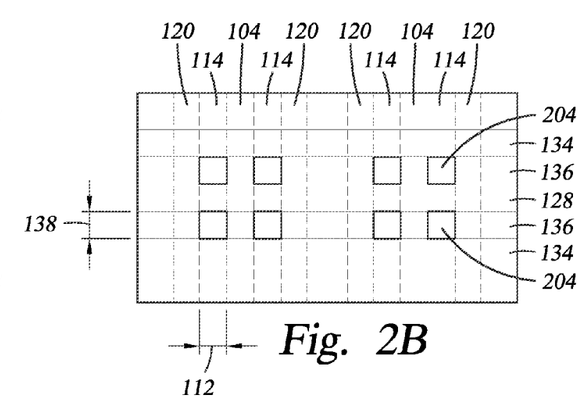
Figure 2C:
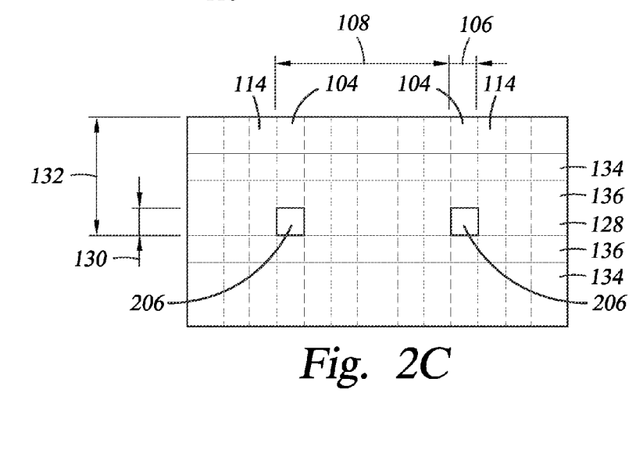
Figure 2D:
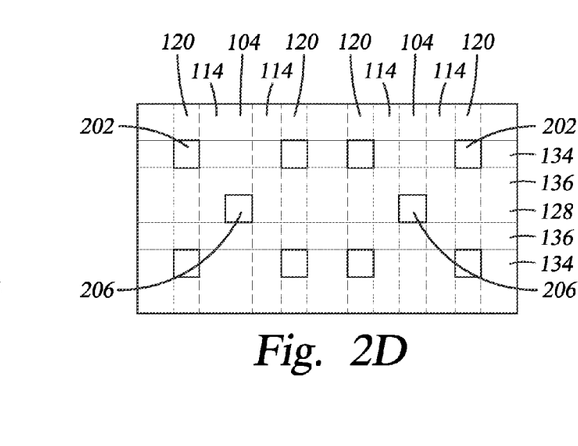

Referring to FIG. 2B, rectangular openings 204 are formed by selectively etching through the core lines 104 and the traverse core lines 128, which are formed from the same material. As illustrated in FIG. 2C, rectangular openings 206 are formed by selectively etching through the first spacers 114 and the first traverse spacers 134, which are formed from the same material. As illustrated in FIG. 2D, rectangular openings 202 and 206 are formed by selectively etching through the core lines 104 and the traverse core lines 128, which are formed from the same material and selectively etching through the second spacers 120 and the second traverse spacers 136, which are formed from the same material. Etching through the lines 104, 128 and spacers 120, 136 may be performed simultaneously or separately depending on the materials and the etching chemistry used. The rectangular openings 202, 204, 206 illustrated in FIGS. 2A-2D can then be transferred to the hardmask layer 104 by etching the hardmask layer 104 using the remaining core lines and spacers as a mask. In one embodiment, the etching process may include generating bias RF plasma to provide directional ions to punch through FCVD layer between the traverse line clusters 142 and the line clusters 121 so that the etch chemistry can reach the line clusters 121.

As illustrated in FIGS. 2A-2B, the shapes, dimensions, and relative locations of the openings 202, 204, 206 are results of overlay of between the core lines 104 and the traverse core lines 128, the CD 106 and pitch 108 of the core lines 104, the CD 130 and pitch 132 of the traverse core lines 128, the thickness 112, 118, 138, 140 of the first spacers 104, second spacers 114, first traverse spacers 134, second spacers 136, respectively. By controlling overlay, CDs, pitches, and thicknesses, patterns with rectangular openings of various dimensions and relative positions may be formed using embodiments of the present disclosure. The rectangular openings 202, 204, 206 may be used for fabricating various structures in a semiconductor devices, such as vias for forming interlayer connections or vertical channels for flash memory.

Figure 3:
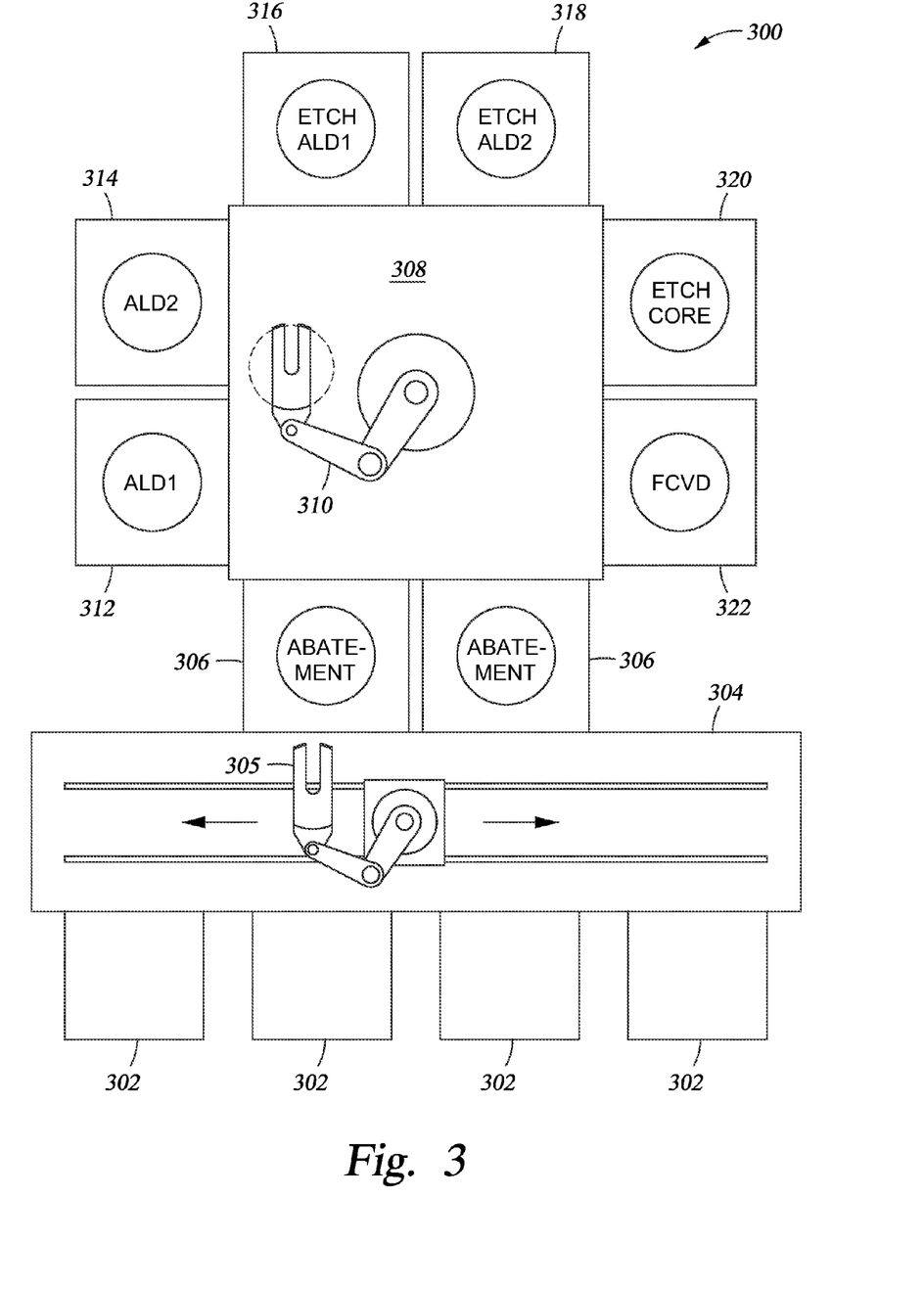
FIG. 3 is a schematic plan view of a cluster tool arrangement according to one embodiment of the present disclosure.

FIG. 3 is a schematic plan view of a cluster tool arrangement 300 according to one embodiment of the present disclosure. The cluster tool arrangement 300 includes ALD chambers, etching chambers, and a FCVD chamber for performing the patterning sequence discussed in FIGS. 1A-1H and FIGS. 2A-2D within the cluster tool arrangement 300.

The cluster tool arrangement 300 includes a factory interface 304 which is selectively coupled to a transfer chamber 308 by load lock chambers 306. The factory interface 304 may include at least one docking station 302 and at least one factory interface robot 305 to facilitate transfer of substrates.

The transfer chamber 308 has a vacuum robot 310 disposed therein for transferring substrates among the load lock chambers 306 and a plurality of processing chambers. The processing chambers of the cluster tool arrangement 300 may include two ALD chambers 312, 314 configured for depositing two spacer layers of different materials respectively; three etch chambers 316, 318, 320 configured for selectively etching the two spacer layers of the different materials and the core material, respectively; and a FCVD chamber configured for forming a gap fill layer by FCVD. In one embodiment, the load lock chambers 306 may be dual chambers each having a processing chamber and a load lock chamber vertically stacked together. The processing chamber in the load lock chamber 306 may provide additional substrate processing functions to the cluster tool arrangement 300. In one embodiment, each of the load lock chambers 306 may include an abatement chamber for performing abatement after each etching process.

The cluster tool arrangement 300 as shown in FIG. 3 includes dedicated chambers for performing all the processes in the sequence shown in FIGS. 1A-1H and FIGS. 2A-2D, except for lithography for patterning the core lines 104 and the traverse core lines 128.

Figure 4:
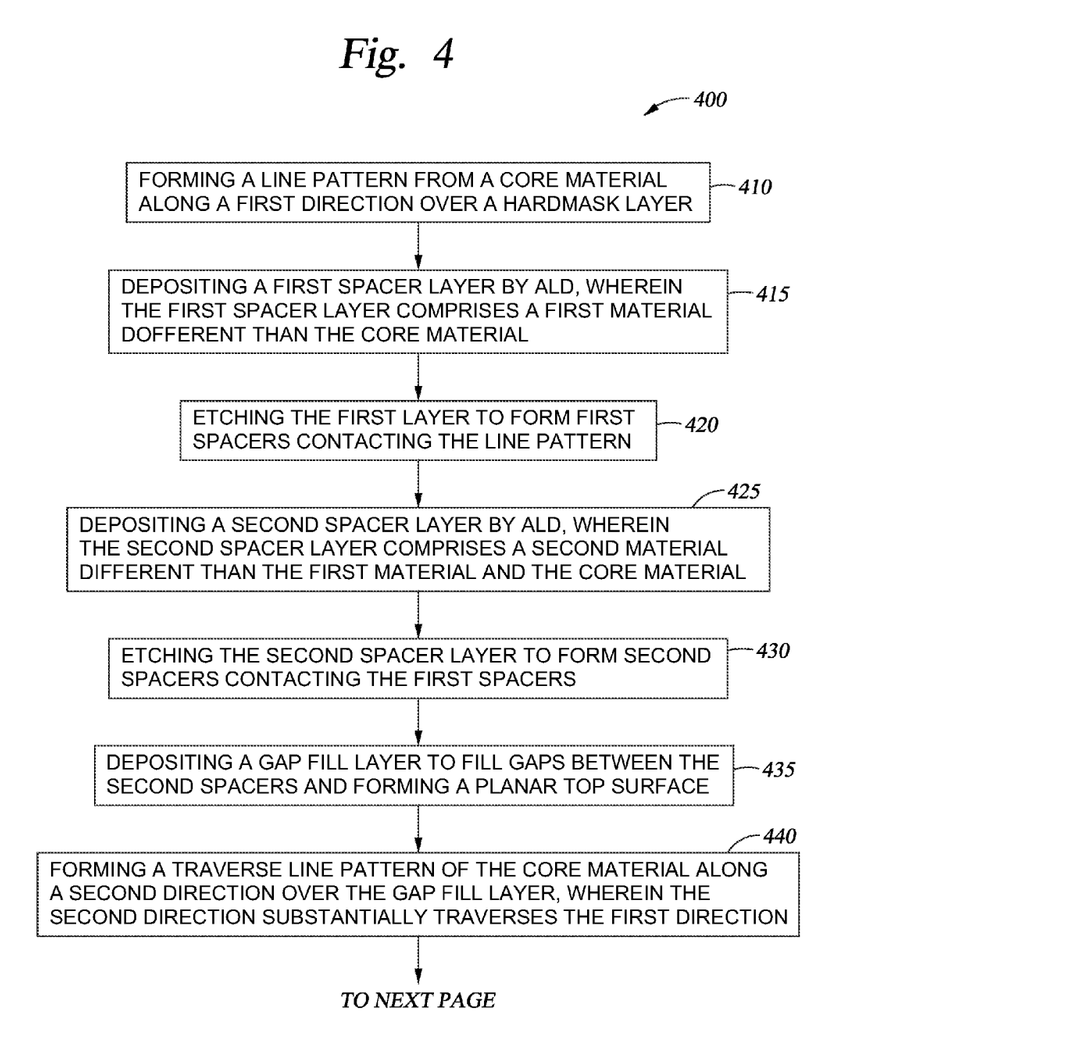
FIG. 4 is a flow chart showing a method for generating a pattern having rectangular openings according to one embodiment of the present disclosure.

FIG. 4 is a flow chart showing a method 400 for generating a pattern having rectangular openings according to one embodiment of the present disclosure. In box 410, a core lines may be formed in a core material layer along a first direction over a hardmask layer, which is over a substrate to be patterned. The core material may include silicon or silicon oxide. In one embodiment, the core material may be amorphous silicon, or amorphous silicon oxide. FIG. 1A schematically illustrates a substrate after forming the core lines. The core lines may be formed by forming a photoresist mask by standard photolithography process, etching the core material layer using the photoresist mask, and removing the photoresist mask by ashing. Alternatively, a double or multiple patterning process may be perform to obtain smaller CD and pitch in the core lines. An exemplary multiple patterning process is described below with FIGS. 5A-5F and FIG. 6.

After the core lines are formed, the substrate may be transferred to a cluster tool, such as the cluster tool arrangement 300, to perform portions of the method 400 described in box 415 to box 435. In box 415, a first spacer layer including a first material may be formed by ALD as shown in FIG. 1B. The first spacer layer may be deposited in the ALD chamber 312 that is dedicated to deposit the first material by ALD. The first material can be selectively etched with respect to the core material. In one embodiment, the first material may be one of silicon oxide, silicon nitride, titanium nitride, phosphorous oxide, aluminum oxide, or the like.

In box 420, the first spacer layer is etched to form first spacers in contact with the core lines, as shown in FIG. 1C. The first spacer layer may be etched in the etch chamber 316 that is dedicated to selectively etching the first material. For example, an etch chemistry used by the etch chamber 316 for selectively etching the first material may have etch rates for the first material and the core material at a ratio of greater than 10:1. In one embodiment, the etch chemistry may have etch rates for the first material and the core material at a ratio of greater than 50:1. Suitable etching chemistry may be selected to use in the etch chamber 316. For example, a processing gas comprising carbon tetrafluoride ($CF_4$), oxygen gas ($O_2$) and nitrogen gas ($N_2$) may be used to selectively etch the first material when the core material is amorphous silicon and the first material is silicon nitride. A processing gas comprising carbon tetrafluoride ($CF_4$) and hydrogen gas ($O_2$) may be used to selectively etch the first material when the core material is amorphous silicon and the first material is silicon oxide.

In box 425, a second spacer layer including a second material may be formed by ALD as shown in FIG. 1D. The second spacer layer may be formed in the ALD chamber 314 that is dedicated to deposit the second material by ALD. The second material can be selectively etched with respect to the core material and the first material. In one embodiment, the second material may be one of silicon oxide, silicon nitride, titanium nitride, phosphorous oxide, aluminum oxide, or the like and different from the first material.

In box 430, the second spacer layer is etched to form second spacers in contact with the first spacers, as shown in FIG. 1E. The second spacer layer may be etched in the etch chamber 318 that is dedicated to selectively etch the second material. For example, an etch chemistry used by the etch chamber 318 for selectively etching the second material may have etch rates for the second material, the core material and first material at a ratio of greater than 10:1:1. In one embodiment, the etch chemistry may have etch rates for the second material, the core material and the first material at a ratio of greater than 50:1:1. Suitable etching chemistry may be selected to use in the etch chamber 318. For example, a processing gas comprising carbon tetrafluoride ($CF_4$), oxygen gas ($O_2$) and nitrogen gas ($N_2$) may be used to selectively etch the second material when the core material is amorphous silicon, the first material is silicon oxide, and the second material is silicon nitride. A processing gas comprising carbon tetrafluoride ($CF_4$) and hydrogen gas ($O_2$) may be used to selectively etch the first material when the core material is amorphous silicon, the first material is silicon nitride, and the second material is silicon oxide.

In box 435, a gap fill layer may be formed over the substrate as shown in FIG. 1F. The gap fill layer may be deposited by the FCVD chamber 322. The gap fill layer may be formed from a material that can be selectively etched from the second material. In one embodiment, the gap fill layer may be a silicon oxide layer formed by FCVD when the second material is silicon nitride. Alternatively, the gap fill layer may be a silicon nitride layer formed by FCVD when the second material is silicon oxide.

In box 440, a traverse core lines may be formed over the gap fill layer, as shown in FIG. 1G. Similar to box 410, box 440 may be performed by a standard lithography process or a double/multiple patterning process depending on the CD and pitch of the traverse core lines. When using the cluster tool arrangement 300, the substrate may need to be transferred out of the cluster tool arrangement 300 to perform box 440. After the traverse core lines are deposited, the substrate may be transferred back to the cluster tool arrangement 300 to perform box 445 to box 460.

In box 445, a first traverse spacer layer of the first material or the second material may be formed by an ALD process. The first traverse spacer layer may be deposited by the ALD chamber 312 if the first material is used and by the ALD chamber 314 if the second material is used.

In box 450, first traverse spacers may be formed by selectively etching the first traverse spacer layer. The first traverse spacers may be etched by the etch chamber 316 if the first traverse spacer layer includes the first material and by etch chamber 318 if the first traverse spacer layer includes the second material.

In box 455, a second traverse spacer layer of the second material or the first material may be formed by an ALD process. The second traverse spacer layer is formed from different material than the first traverse spacer layer. The second traverse spacer layer may be deposited by the ALD chamber 312 if the first material is used and by the ALD chamber 314 if the second material is used.

In box 460, second traverse spacers may be formed by selectively etching the second traverse spacer layer, as shown in FIG. 1H. The second traverse spacers may be etched by the etch chamber 316 if the second traverse spacer layer includes the first material and by etch chamber 318 if the second traverse spacer layer includes the second material.

In box 465, at least one of the core material, first material and second material may be selectively removed by etching to expose rectangular regions of the hardmask layer, as shown in FIGS. 2A-2D. The etch chamber 320, which is dedicated for selectively etching the core layer, may be used when the core layer is to be selectively etched. A processing gas comprising chlorine gas ($Cl_2$), or bromine ($Br_2$) or hydrogen bromide (HBr) may be used for selectively etching the core material when the core material is amorphous silicon, the first and second materials are silicon oxide and silicon nitride.

FIGS. 5A-5F schematically illustrate a sequence for generating a core lines in a core layer 501 according to one embodiment of the present disclosure. The sequence may be used to perform the process described in box 410 and box 440 of the method 400.

Figure 5A:
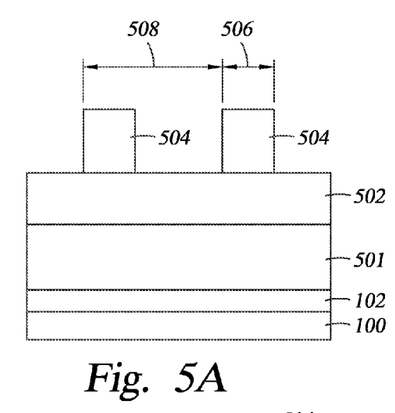
FIGS. 5A-5F schematically illustrate a sequence for generating a core lines in a core layer according to one embodiment of the present disclosure.
Figure 5B:
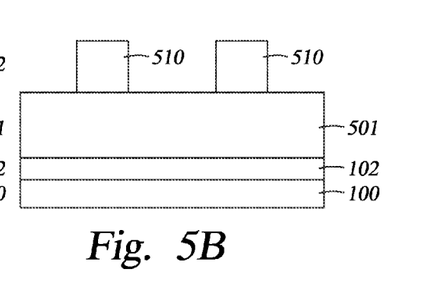
Figure 5C:
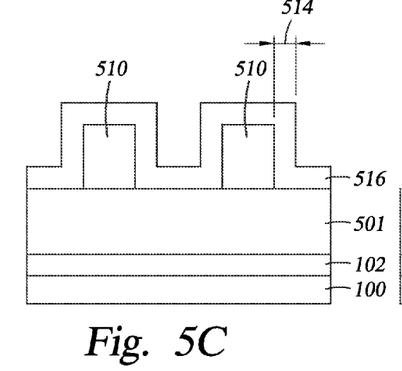
Figure 5D:
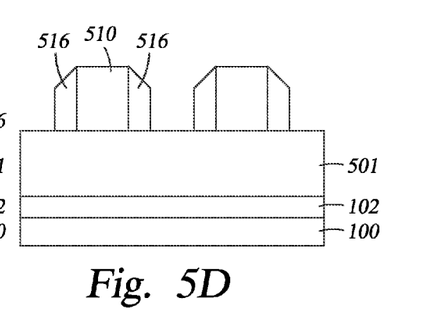
Figure 5E:
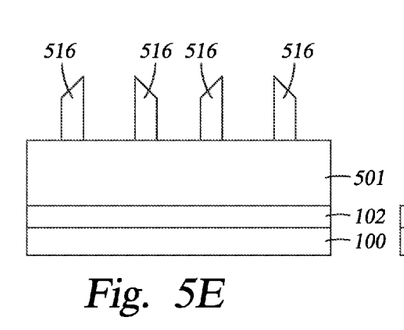
Figure 5F:
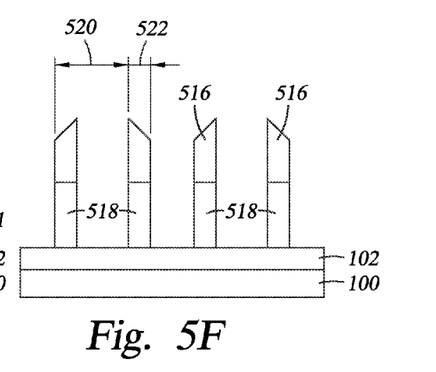

Referring to FIG. 5A, a sacrifice layer 502 is formed over the core layer 501. Photoresist lines 504 of a CD (width) 506 and pitch 508 may be formed by a standard photolithography. As shown in FIG. 5B, the photoresist lines 504 are transferred to the sacrifice layer 502 forming sacrifice lines 510. As shown in FIG. 5C, a spacer layer 512 having a thickness 514 is formed over the sacrifice lines 510. The spacer layer 512 may be formed by ALD. As shown in FIG. 5D, the spacer layer 512 is selectively etched to form spacers 516 on both sides of the sacrifice lines 510. As shown in FIG. 5E, the sacrifice lines 510 are removed by selective etch leaving spacers 516 over the core layer 501. In FIG. 5F, the sacrifice lines 510 are transferred to the core layer 501 forming core lines 518. The core lines 518 have a CD 522 and a pitch 520. The CD 522 of the core lines 518 is substantially similar to the thickness of the spacer layer 512. The pitch 520 of the core lines 518 is about half of the pitch 508 of the photoresist lines 504. The sequence of FIGS. 5A-5F may be used to form core lines with reduced CDs and half pitch of the original photoresist mask, thus, significantly scaling down the standard photolithography dimensions.

Figure 6:
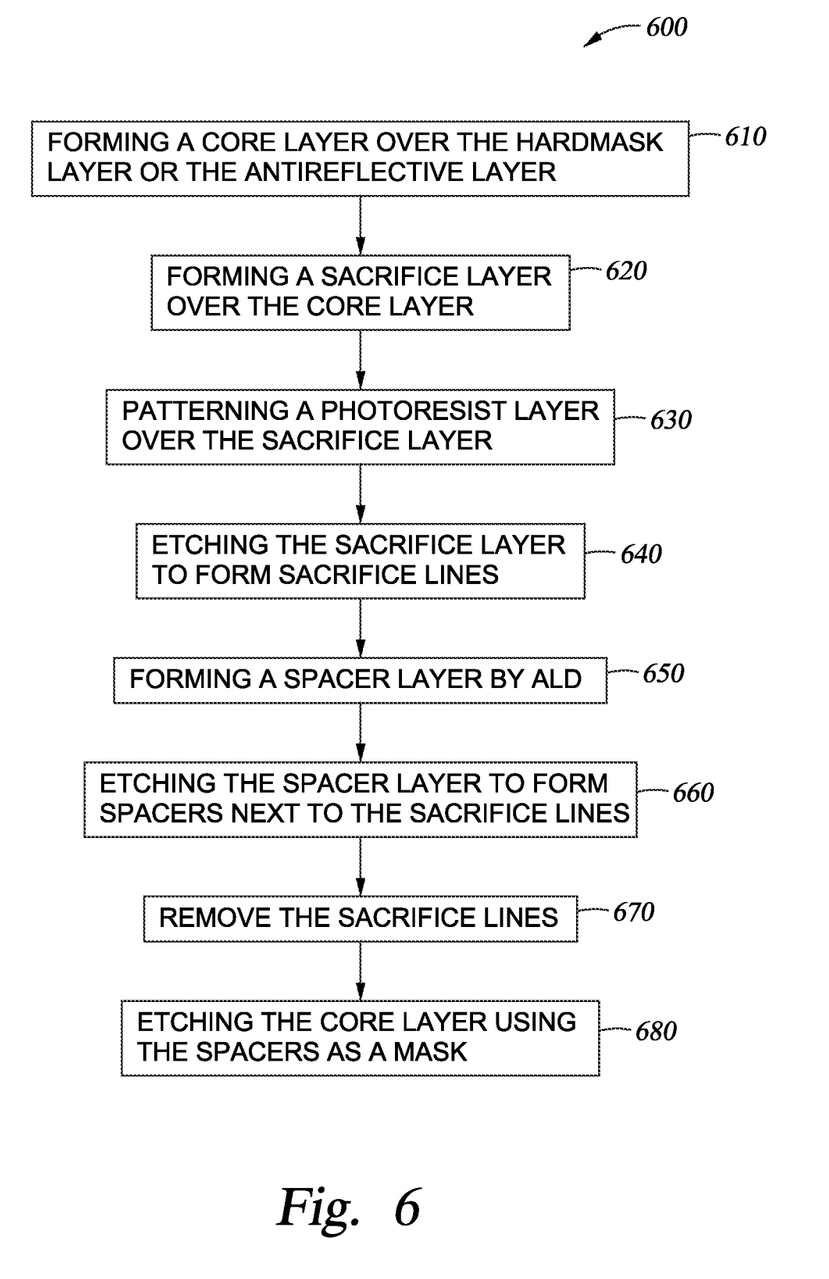
FIG. 6 is a flow chart showing a method for generating a core lines according to one embodiment of the present disclosure.

FIG. 6 is a flow chart showing a method 600 for generating a core lines with reduced CD and pitch according to one embodiment of the present disclosure. In box 610, a core material may be formed over a hardmask layer or a layer to be patterned, as shown in FIG. 5A. In box 620, a sacrifice layer is formed over the hardmask layer, as shown in FIG. 5A. In box 630, photoresist pattern may be formed over the sacrifice layer using standard photolithography as shown in FIG. 5A. In Box 640, the photoresist pattern is transferred to the sacrifice layer to form sacrifice lines as shown in FIG. 5B. In box 650, a spacer layer is formed over the sacrifice lines by an ALD process as shown in FIG. 5C. In box 660, the spacer layer is etched to form spacers in contact with the sacrifice lines as shown in FIG. 5C. In Box 670, the sacrifice lines are removed leaving the spacers as a mask over the core layer as shown in FIG. 5E. In box 680, core lines in the core layer are removed using the spacers as mask as shown in FIG. 5F.

In one embodiment of the present disclosure, a cluster tool arrangement includes a transfer chamber, two or more ALD chambers coupled to the transfer chamber, wherein each of the two or more ALD chambers is configured to deposit a different one of two or more materials, two or more etch chambers coupled to the transfer chamber, wherein each of the two or more etch chambers is configured to selective etch a different one of the two or more materials, and a FCVD chamber coupled to the transfer chamber.

In one or more embodiment, the two or more ALD chambers comprises a first ALD chamber configured to form a first material, a second ALD chamber configured to form a second material.

In one or more embodiment, two or more etch chambers comprises a first etch chamber configured to selectively etch the first material, a second etch chamber configured to selectively etch the second material, and a third etch chamber configured to etch a core material.

While the foregoing is directed to embodiments of the present disclosure, other and further embodiments of the disclosure may be devised without departing from the basic scope thereof, and the scope thereof is determined by the claims that follow.

The invention claimed is:

1. A method for patterning a substrate, comprising:
forming a hardmask layer over the substrate;
forming first line clusters along a first direction, wherein the first line clusters are separated by parallel gaps, each of the first line clusters comprises a core line formed from a core material and first spacers formed on sidewalls of the core line, the first spacers fabricated from a first material, wherein the core material is selected from a group consisting of amorphous silicon, amorphous silicon oxide, amorphous carbon, polycrystalline silicon and silicon nitride, wherein forming the first line clusters further comprises;
forming the core lines over the hardmask layer;
depositing the first material over the core lines by an atomic layer deposition process;
forming the first spacers by selectively etching the first material to expose the core lines and the hardmask layer;
depositing a second material over the core lines and the first spacers by an atomic layer deposition process; and
forming second spacers by selectively etching the second material to expose the core lines, the first spacers and the hardmask layer;
forming a gap fill layer to planarize the first line clusters; and
forming second line clusters over the gap fill layer along a second direction, wherein the second direction substantially traverses the first direction, each of the second line dusters comprises a traverse core line and at least first traverse spacers formed on sidewalls of the transverse core line.

2. The method of claim 1, wherein forming the second line clusters comprises:
forming the traverse core lines over the gap fill layer;
depositing a third material over the traverse core lines by an atomic layer deposition process; and
forming first traverse spacers by selectively etching the third material to expose the traverse core lines and the gap fill layer.

3. The method of claim 2, wherein forming the second line clusters further comprises:
depositing a fourth material over the traverse core lines and the first traverse spacers by an atomic layer deposition process; and
forming second traverse spacers by selectively etching the fourth material to expose the traverse core lines, the first traverse spacers and the gap fill layer.

4. The method of claim 1, wherein forming the core lines comprises:
depositing a layer of the core material over the hardmask layer;
forming photoresist lines over the layer of the core material;
etching the layer of the core material using the photoresist lines as a mask; and
removing the photoresist lines.

5. The method of claim 1, wherein forming the core lines comprises:
depositing a layer of the core material over the hardmask layer;
depositing a sacrifice layer over the layer of the core material;
forming photoresist lines over the sacrifice layer;
etching the sacrifice layer using the photoresist lines as a mask to form sacrifice lines;
depositing a spacer layer over the sacrifice lines by an atomic layer deposition process;
selectively etching the spacer layer to form spacers in contact with the sacrifice lines;
removing the sacrifice lines;
etching the layer of the core material using the sacrifice lines as a mask; and
removing the sacrifice lines.

6. The method of claim 2, wherein the third material is the same as the first material.

7. A method for forming a pattern comprising rectangular openings, comprising:
- forming core lines along a first direction, wherein the core lines are formed from a first core material, wherein the first core material is selected from a group consisting of amorphous silicon, amorphous silicon oxide, amorphous carbon, polycrystalline silicon and silicon nitride;
- depositing a first material over the core lines by an atomic layer deposition process;
- selectively etching the first material to form first spacers in contact with sidewalls of the core lines;
- depositing a second material over the core lines and the first spacers by an atomic layer deposition process;
- selectively etching the second material to form second spacers in contact with sidewalls of the first spacers;
- forming a gap fill layer over the core lines and the first spacers;
- forming traverse core lines along a second direction, wherein the traverse core lines are formed from a second core material, the second direction substantially traverses the first direction;
- depositing a third material over the traverse core lines by an atomic layer deposition process;
- selectively etching the third material to form first traverse spacers in contact with sidewalls of the traverse core lines;
- depositing a fourth material over the traverse core lines and the first traverse spacers by an atomic layer deposition process; and
- selectively etching the fourth material to form second traverse spacers in contact with sidewalls of the first traverse spacers.

8. The method of claim 7, wherein the first core material is the same as the second core material and the first material is the same as the third material.

9. The method of claim 7, wherein the second material is the same as the fourth material.

* * * * *

UNITED STATES PATENT AND TRADEMARK OFFICE
CERTIFICATE OF CORRECTION

PATENT NO. : 9,698,015 B2
APPLICATION NO. : 14/505154
DATED : July 4, 2017
INVENTOR(S) : Srinivas D. Nemani Page 1 of 1

It is certified that error appears in the above-identified patent and that said Letters Patent is hereby corrected as shown below:

In the Claims

In Column 10, Line 20, in Claim 1, delete "dusters" and insert -- clusters --, therefor.

In Column 10, Line 22, in Claim 1, delete "transverse" and insert -- traverse --, therefor.

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*